(12) United States Patent
Marcu et al.

(10) Patent No.: US 12,417,390 B2
(45) Date of Patent: Sep. 16, 2025

(54) ENHANCED DIGITAL SIGNAL PROCESSOR (DSP) NAND FLASH (71) Applicant: Sandisk Technologies, Inc., Milpitas, CA (US)

(72) Inventors: Alon Marcu, Tel-Mond (IL); Ariel Navon, Revava (IL); Judah Gamliel Hahn, Ofra (IL); Shay Benisty, Beer Sheva (IL); Eran Sharon, Rishon Lezion (IL); Karin Inbar, Ramat Hasharon (IL)

(73) Assignee: Sandisk Technologies, Inc., Milpitas, CA (US)

( * ) Notice: Subject to any disclaimer, the term of this patent is extended or adjusted under 35 U.S.C. 154(b) by 1055 days.

(21) Appl. No.: 17/349,508

(22) Filed: Jun. 16, 2021

(65) Prior Publication Data

US 2022/0405601 A1 Dec. 22, 2022

(51) Int. Cl.
*G06N 3/084* (2023.01)
*G06F 7/544* (2006.01)
(Continued)

(52) U.S. Cl.
CPC ........... *G06N 3/084* (2013.01); *G06F 7/5443* (2013.01); *G06F 7/57* (2013.01); *G06N 3/061* (2013.01)

(58) Field of Classification Search
CPC ........ G06N 3/084; G06N 3/061; G06N 3/063; G06F 7/5443; G06F 7/57; G06F 3/061;
(Continued)

(56) References Cited

U.S. PATENT DOCUMENTS 6,545,907 B1 4/2003 Lowrey et al.
7,075,841 B2 7/2006 Resta et al.
(Continued)

FOREIGN PATENT DOCUMENTS

CN 106485317 A 3/2017
CN 107301455 A 10/2017
(Continued)

OTHER PUBLICATIONS

Yangyang Pan et al., Using Quasi-EZ-NAND Flash Memory to Build Large-Capacity Solid-State Drives in Computing Systems, IEEE Transactions on Computers, vol. 62, No. 5, May 2013, 7 pages.
(Continued)

*Primary Examiner* — Farley Abad
(74) *Attorney, Agent, or Firm* — Patterson + Sheridan, LLP (57) ABSTRACT

A method and apparatus for systems and methods for digital signal processing (DSP) in a non-volatile memory (NVM) device comprising CMOS coupled to NVM die, of a data storage device. According to certain embodiments, one or more DSP calculations are provided by a controller to the CMOS components of the NVM, that configure one or more memory die to carry out atomic calculations on the data resident on the die. The results of calculations of each die are provided to an output latch for each die, back-propagating data back to the configured calculation portion as needed, otherwise forwarding the results to the controller. The controller aggregates the results of DSP calculations of each die and presents the results to the host system.

20 Claims, 5 Drawing Sheets

(51) Int. Cl.
*G06F 7/57* (2006.01)
*G06N 3/06* (2006.01)

(58) Field of Classification Search
CPC .... G06F 3/0659; G06F 3/0679; G06F 3/0688; G06F 2212/1024; G06F 2212/7203; G06F 12/0238; G06F 15/7821; G06F 2212/7208; G11C 11/54; G11C 16/0483
See application file for complete search history.

(56) References Cited

U.S. PATENT DOCUMENTS

| | | | |
|---|---|---|---|
| 7,274,586 | B2 | 9/2007 | Choi et al. |
| 7,983,069 | B2 | 7/2011 | Hsu et al. |
| 8,199,566 | B1 | 6/2012 | Fackenthal et al. |
| 8,725,935 | B2 | 5/2014 | Huang et al. |
| 9,530,491 | B1 | 12/2016 | Uttarwar et al. |
| 9,646,243 | B1 | 5/2017 | Gokmen |
| 9,697,077 | B2 | 7/2017 | Sokolov et al. |
| 9,880,760 | B2 | 1/2018 | Inbar et al. |
| 9,997,232 | B2 | 6/2018 | Murphy |
| 10,741,247 | B1 | 8/2020 | Yeh et al. |
| 2009/0138687 | A1 | 5/2009 | Kang |
| 2010/0027329 | A1 | 2/2010 | Lee et al. |
| 2012/0311262 | A1 | 12/2012 | Franceschini et al. |
| 2013/0013860 | A1 | 1/2013 | Franceschini et al. |
| 2014/0129753 | A1* | 5/2014 | Schuette ............. G06F 13/4068 710/301 |
| 2016/0085464 | A1 | 3/2016 | Tuers et al. |
| 2016/0092129 | A1 | 3/2016 | Agarwal et al. |
| 2017/0063394 | A1 | 3/2017 | Halbert et al. |
| 2017/0068451 | A1 | 3/2017 | Kenan et al. |
| 2017/0200078 | A1 | 7/2017 | Bichler |
| 2017/0270403 | A1 | 9/2017 | Zhang |
| 2017/0337466 | A1 | 11/2017 | Bayat et al. |
| 2018/0052766 | A1* | 2/2018 | Mehra .................. G06F 3/0661 |
| 2018/0075338 | A1 | 3/2018 | Gokmen |
| 2018/0075344 | A1 | 3/2018 | Ma et al. |
| 2018/0232508 | A1 | 8/2018 | Kursun |
| 2018/0330238 | A1 | 11/2018 | Luciw et al. |
| 2019/0043836 | A1* | 2/2019 | Fastow .............. H01L 25/0657 |
| 2019/0243787 | A1 | 8/2019 | Mittal et al. |
| 2019/0258920 | A1 | 8/2019 | Lie et al. |
| 2020/0174749 | A1 | 6/2020 | Kang et al. |
| 2020/0184335 | A1 | 6/2020 | Rom et al. |
| 2020/0185027 | A1 | 6/2020 | Rom et al. |
| 2021/0342676 | A1* | 11/2021 | Hoang .................... G06N 3/04 |
| 2022/0091775 | A1* | 3/2022 | Shridhar ............... G06F 3/0659 |
| 2023/0153032 | A1* | 5/2023 | Shin ..................... G06F 3/0611 711/154 |

FOREIGN PATENT DOCUMENTS

| | | |
|---|---|---|
| KR | 20180028966 A | 3/2018 |
| KR | 20180116094 A | 10/2018 |

OTHER PUBLICATIONS

Kota Ando, et al., In-Memory Area-Efficient Signal Streaming Processor Design for Binary Neural Networks, 978-1-5090-6389-5/17/$31.00 © 2017 IEEE, 4 pages.

International Search Report and Written Opinion for International Application No. PCT/US2019/050105, dated Nov. 3, 2020, 13 pages.

Hadidi et al, "Demystifying the Characteristics of 3D-Stacked Memories: A Case Study for Hybrid Memory Cube," Georgia Institute of Technology, Oct. 3, 2017, 10 pages <https://arxiv.org/pdf/1706.02725.pdf>.

Park et al, "A hybrid flash translation layer design for SLC-MLC flash memory based multibank solid state disk," Microprocessors and Microsystems, vol. 35, Issue 1, Feb. 2011, pp. 48-59 https://doi.org/10.1016/j.micpro.2010.08.001.

Chi et al., "Prime: A Novel Processing-in-memory Architecture for Neural Network Computation in ReRAM-based Main Memory", 2016 ACM SIGARCH Computer Architecture News Jun. 18, 2016 (vol. 44, No. 3, pp. 27-39). IEEE Press. <https://seal.ece.ucsb.edu/sites/seal.ece.ucsb.edu/liles/publications/prime_isca_2016.pdf>.

Choe et al, "Near-Data Processing for Machine Learning", 2017, International Conference on Learning Representations. 12 pages. <https://openreview.nel/pdf?id=H1_EDpogx>.

Sullivan, John, "Merging Memory and Computation, Programmable Chip Speeds AI, Slashes Power Use", Nov. 15, 2018, 5 pages <https://m.techxplore.com/news/2018-11-merging-memory-programmable-chip-ai.html>.

Jia et al, "A Microprocessor Implemented in 65nm CMOS with Configurable and Bit-scalable Accelerator for Programmable In-memory Computing", Nov. 9, 2018, 10 pages <https://arxiv.org/pdf/1811.04047.pdf>.

Valavi et al, "A Mixed-Signal Binarized Convolutional-Neural-Network Accelerator Integrating Dense Weight Storage and Multiplication for Reduced Data Movement", VLSI Symp. on Circuits {VLSIC), Jun. 2018. 2 pages. <http://www.princeton.edu/-nvermaNermaLabSite/Publications/2018NalaviRamadgeNestlerVerma VLS 118.pdf>.

Nielsen, Michael "Neural Networks and Deep Learning, Chapter 2: How the backpropagation algorithm works", 2015, 27 pages <http://neuralnetworksanddeeplearning.com/chap2.html>.

International Search Report and Written Opinion for International Application No. PCT/US2022/015234 dated May 31, 2022.

* cited by examiner

ENHANCED DIGITAL SIGNAL PROCESSOR (DSP) NAND FLASH

BACKGROUND OF THE DISCLOSURE

Field of the Disclosure

Embodiments of the present disclosure generally relate to computation on a data storage device, and more particularly, to digital signal processing on a non-volatile memory (NVM) device.

Description of the Related Art

Digital signal processing (DSP) with large amounts of data conventionally is a resource intensive task, typically requiring management of a host system to implement calculation methods, in addition to the acquisition of data from storage and processing of that data. Host system resources utilized for this task may be unavailable for other processing tasks, possibly for extended periods of time. Examples of DSP computation tasks include search, data filtering, machine learning (e.g., neural network, regression, state vector machines, clustering, and others, in addition to optimizing associated parameters), counting within large bodies of data, and the like.

Therefore, there is a need in the art to efficiently execute DSP within a data storage device.

SUMMARY OF THE DISCLOSURE

A method and apparatus for systems and methods for digital signal processing (DSP) in a non-volatile memory (NVM) device comprising CMOS coupled to NVM die, of a data storage device. According to certain embodiments, one or more DSP calculations are provided by a controller to the CMOS components of the NVM which configure one or more memory die to carry out atomic calculations on the data resident on the die. The results of calculations of each die are provided to an output latch for each die, back-propagating data back to the configured calculation portion as needed, otherwise forwarding the results to the controller. The controller aggregates the results of DSP calculations of each die and presents the results to the host system.

In one embodiment, a data storage device is disclosed that includes a memory device comprising a plurality of CMOS structures, each CMOS structure coupled to a portion of an NVM die, and a controller. The controller is configured to cause the data storage device to receive a command to perform a digital signal processing (DSP) computation, encode a portion of the DSP computation to each CMOS structure of the plurality of CMOS structures of the memory device; and receive an output of the DSP computation from the plurality of CMOS structures of the memory device.

In another embodiment, a controller for a data storage device is disclosed, that includes a memory device comprising computer-readable instructions, and a processor configured to read the computer-readable instructions that cause the processor to execute a method for digital signal processing. The method includes storing a portion of data of a data set on an NVM die of a plurality of NVM dies, the portion of data comprising an atomic unit of data, receiving a digital signal processing (DSP) command comprising a plurality of calculations, and encoding a CMOS of an NVM memory device comprising the CMOS coupled to an NVM die of the plurality of NVM dies, with a calculation of the plurality of calculations. The method further includes processing the calculation on the NVM die with the portion of data stored on the NVM die, and receiving a result of processing the calculation.

In another embodiment, a data storage device is disclosed, that includes a memory means, and a controller means configured to perform a method for digital signal processing (DSP). The method includes receiving a command to perform a DSP calculation comprising a plurality of atomic calculation components, encoding a plurality of dies of the memory means, each die encoded to calculate at least one of the plurality of atomic calculation components, and receiving an output of the DSP calculation.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A method and apparatus for systems and methods for digital signal processing (DSP) in a non-volatile memory (NVM) device comprising CMOS coupled to NVM die, of a data storage device. According to certain embodiments, one or more DSP calculations are provided by a controller to the CMOS components of the NVM, that configure one or more memory die to carry out atomic calculations on the data resident on the die. The results of calculations of each die are provided to an output latch for each die, back-propagating data back to the configured calculation portion as needed, otherwise forwarding the results to the controller. The controller aggregates the results of DSP calculations of each die and presents the results to the host system.

Figure 1:
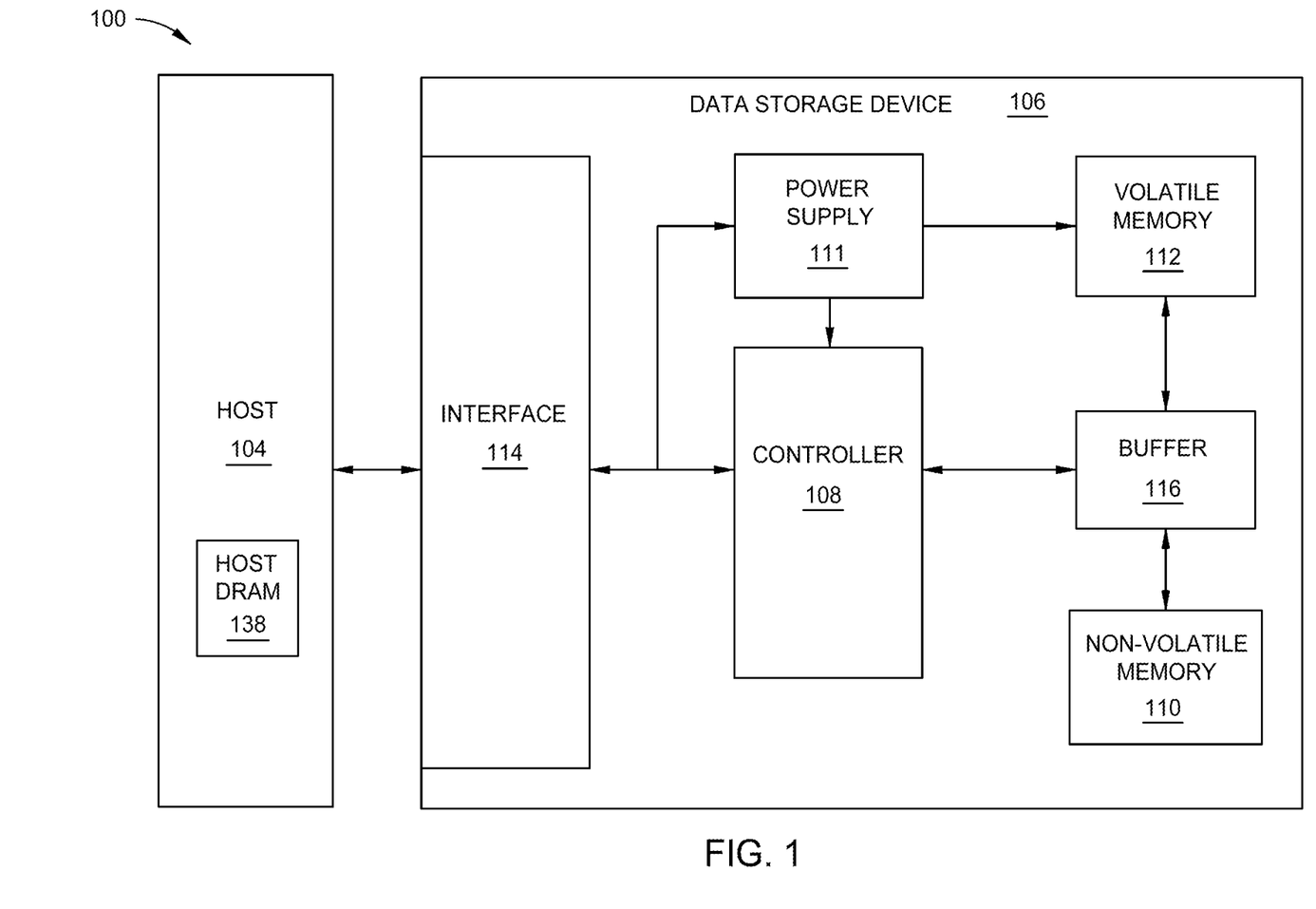
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
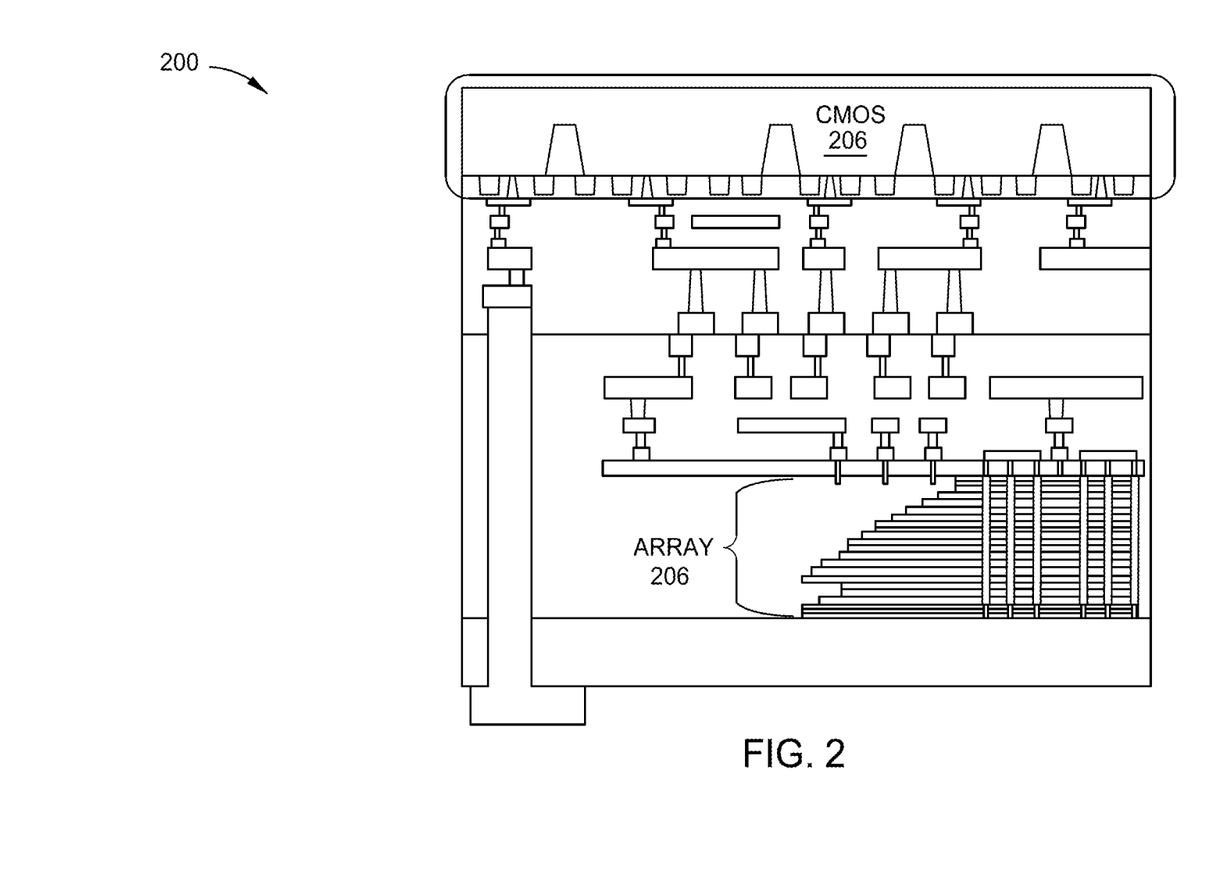
FIG. 2 is a schematic illustration of a Circuit Bounded Array (CbA) architecture, according to certain embodiments.

FIG. 2 is a schematic illustration of a Circuit Bounded Array (CbA) architecture 200, according to one embodiment. The CbA architecture 200 includes one or more complementary metal oxide semiconductor (CMOS) chips 206 coupled to respective one or more memory arrays 208 via one or more connection units. In one embodiment, each memory array 208 comprises a memory die. The CMOS chips 206 may include an encoder unit and a decoder unit as well as similar processing logic as a controller, such as the controller 108. The CMOS chips 206 may further include an error correction code (ECC) engine, which may be part of the encoder unit and the decoder unit. The CMOS chips 206 may be configured to schedule received write commands to program data to the coupled memory die and schedule received read commands to read data from the coupled memory die. It is to be understood that that NAND dies may be referred to as memory dies for exemplary purposes.

In the description herein, it is to be understood that CMOS chips and CbA architecture may be used interchangeably for exemplary purposes, and embodiments described herein may also be applicable to CMOS Under Array (CuA) architectures and CMOS Above Array (CAA) architectures.

Figure 3:
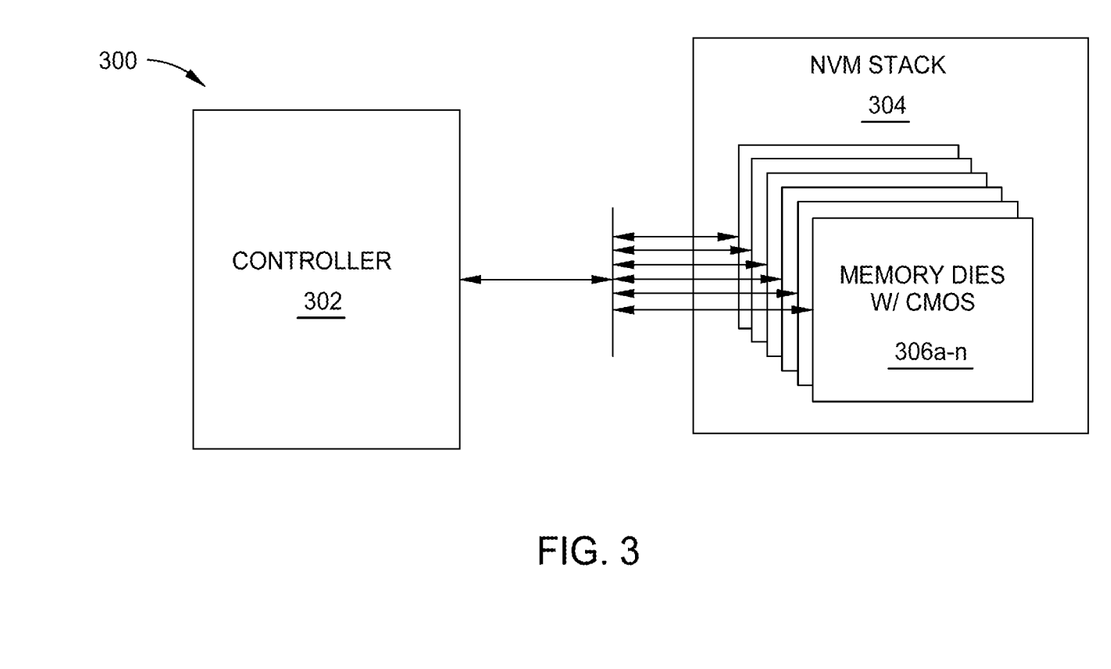
FIG. 3 is a schematic block diagram illustrating a controller managing a plurality of memory dies each including a CMOS chip of an NVM, according to certain embodiments.

FIG. 3 is a schematic block diagram 300 illustrating a controller 302 managing a plurality of memory dies 306a-306n each, including a CMOS chip of an NVM stack 304, according to certain embodiments. The NVM stack 304 may be the NVM 110 of FIG. 1. The controller 302 may be a controller of a host device, such as the host device 104 of FIG. 1, or a controller of the data storage device, such as the controller 108 of FIG. 1. Each CMOS chip, such as the CMOS chip 206 of FIG. 2, of each memory die of the plurality of memory dies 306a-306n may be configured to handle the computational tasks and other relevant data management operations. Furthermore, the CMOS chips may allow for enhanced parallel execution of DSP operations at the NVM level (e.g., at the memory die level).

Parallel computation operations include reading data from the NVM stacks 304 and running operations, such as filtering or searching contents, counting repeated strings, etc. Such operations may require reading large chunks of data from the NVM stack 304, executing logic, such as computational logic, and sending results of the computation logic that may include smaller volumes of data back to the controller 302. Thus, the amount of data transferred to the controller 302 may be reduced, power may be saved, and performance may be improved. The controller 302 may activate one or more memory dies of the plurality of memory dies 306a-306n in parallel to execute the logic with each memory die operating on the data that is written in its own memory. The results of the logic are gathered by the controller 302.

Another type of computational operation may involve of reading data from the NVM stack 304, performing an operation (e.g., compression, image analysis, and filtering, or a mathematical transformation) on the read data, and writing the result of the operation back to the respective memory die of the plurality of memory dies 306a-306n. The data that is operated on may be contained within the memory die and the respective CMOS chip of the memory die. For example, rather than transferring the data to the controller 302 to be operated on, the respective CMOS chip may include the same logic to operate on the data. Thus, the data remains closer to the respective memory die. In one example, the controller 302 may ensure that data that requires internal computational processing or transformation may be processed in parallel by the respective CMOS chips of the plurality of memory dies 306a-306n without transfer between the memory dies.

Figure 4:
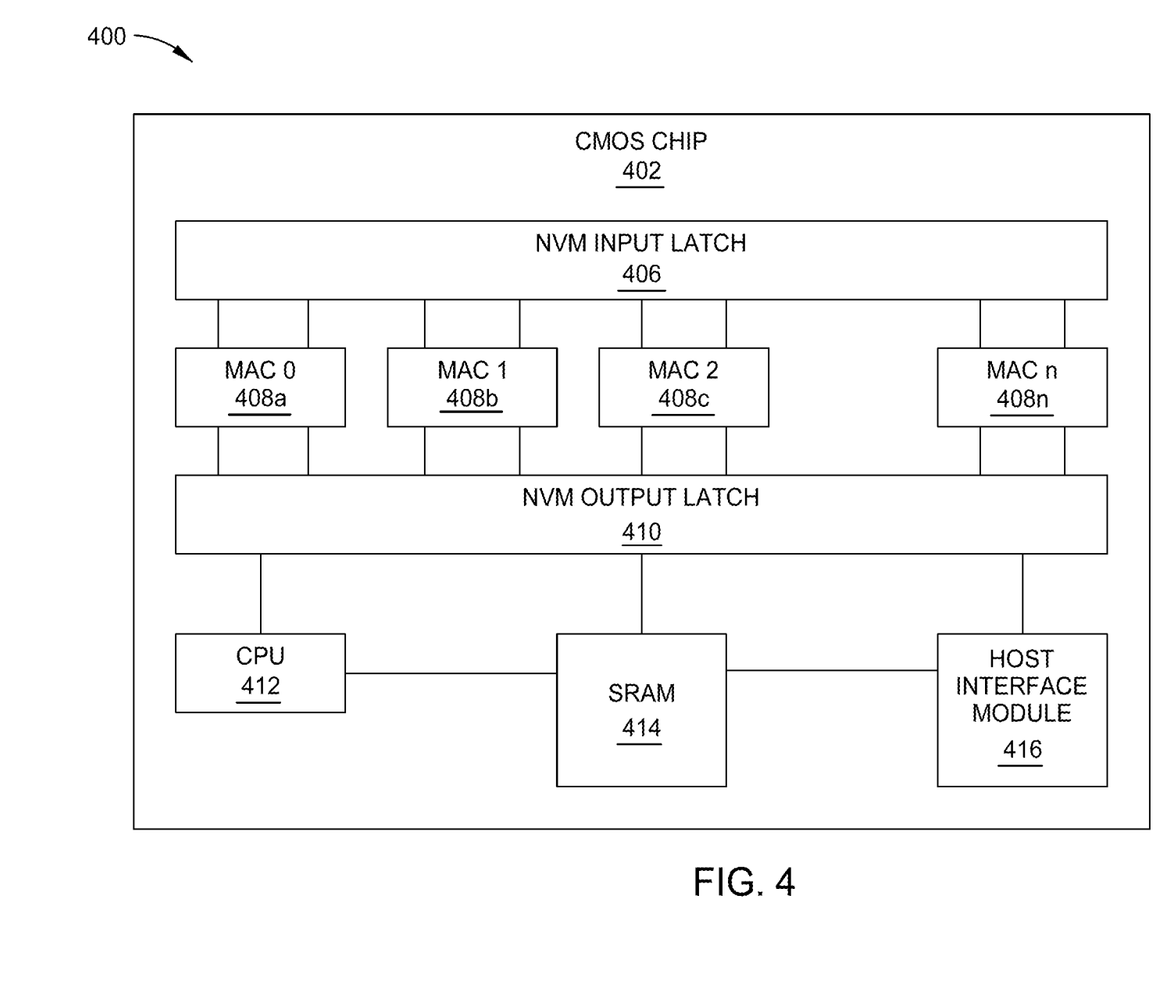
FIG. 4 is a schematic block diagram illustrating a CMOS chip architecture, according to certain embodiments.

FIG. 4 is a schematic block diagram illustrating a CMOS chip architecture 400, according to certain embodiments. The CMOS chip architecture 400 includes a CMOS chip 402. In some examples, the CMOS chip 402 may be the CMOS chip 206 of FIG. 2. The CMOS chip 402 includes a NVM input latch 406, a plurality of multi-accumulate (MAC) units 408a-408n, an NVM output latch 410, a central processing unit (CPU) 412, an SRAM (414), and a host interface module (HIM) 416. The CMOS chip 402 is coupled to a respective memory die of a plurality of memory dies, such as the plurality of memory dies 306a-306n of FIG. 3. For example, the CMOS chip 402 may be coupled to a first memory die 306a. The NVM input latch 406 and the NVM output latch 410 may attach directly to the NVM array, such as the one or more memory arrays 208 of FIG. 2.

The CPU 412 may be configured to schedule data to be programmed to the respective memory die, access the respective memory die, and/or schedule data to be read from the respective memory die using the NVM input latch 406. The NVM input latch 406 retrieves data from the respective memory die and transfers the data to one or more of the plurality of MAC units 408a-408n. The plurality of MAC units 408a-408n processes the input data from the NVM input latch 406 in parallel, such that parallel DSP functions may be performed. It is to be understood that the plurality of MAC units 408a-408n may be one or more MAC units, such as about 64, 128, 256, 512, 1024, and more MAC units. It is to be understood that the plurality MAC units 408a-408n may alternatively be other computational modules, or other computational modules may be included with the plurality of MAC units 408a-408n. The other computational modules may include error correction code (ECC) engines, arithmetic logic units (ALU), CPUs, and the like.

The results of the plurality of MAC units 408a-408n are accumulated or aggregated at the NVM output latch 410, where the results may be programmed back or back-propagated to the respective memory die via the NVM input latch 406. The number of computations by the plurality of MAC units 408a-408n, or N filters, may be completed in parallel. For example, when N equals 512, 1024 computations may be completed in parallel. Additional functionality may be implemented by CPU 412 by using the SRAM 414. Furthermore, the HIM 416 is an interface that allows the host or a controller, such as the controller 108 of FIG. 1, to access and manage the parallel DSP functions. Referring to FIG. 1, the HIM 416 may be a direct connection between the host device 104 and the NVM 110 or a direct connection between the controller 108 and the NVM 110. The host managed DSP functions may allow for hosts to execute intensive parallel computations, such as complex mathematical operations, filtering, counting, compression, image processing (Fourier transforms and the like), machine learning operation (such as forming a machine learning neuron), database searches, mathematical transformations, and the like.

Data may be stored in the memory die according to a zoned namespace, a key value pair, a stream, an endurance group/NVM set, or a device-internal file system of the controller 108. In one example, the CMOS chip 402 may be used with zone namespaces (ZNS) protocol, where a zone is generally targeted at a small number of die-blocks and may be reduced to a single die-block. The data included within a zone, where the zone includes one die, may be considered an atomic unit for internal processing.

In another example, the CMOS chip may be used for key value (KV) pairs, where the KV interfaces assume an internal device processing for assigning a database structure. The KV pairs may be optimally placed in discrete dies for search and update processing. In yet another example, data segregation may be used with streams in order to isolate segments that should fully be contained within a DSP memory die for processing. The DSP memory die may refer to a memory die that is coupled to the CMOS chip 402. Furthermore, the streams may also be used to mark which data units may be placed in conventional non-volatile storage side-by-side with the DSP memory dies.

In yet another example, endurance groups/NVM sets may be used with the CMOS chip 402. The endurance groups/NVM sets may allow for die segregation which isolates specific dies or die groups that may be used for local DSP processing, while allowing other die groups to be used for general purpose storage that does not require the DSP processing. In yet another example, the CMOS chip 402 may be used to present a file system that can be remotely mounted in a network interface. The files may be discrete objects, and the file system abstraction may include attributes that would indicate whether a specific file should be stored in a manner that allows post-processing using the DSP memory dies. Furthermore, post-processing algorithms may be utilized for the DSP memory dies.

Thus, the CMOS chip 402 may allow for a host managed DSP in the memory device, such as the NVM 110 of FIG. 1. Thus, the host, such as the host device 104 of FIG. 1 or the controller 108 of FIG. 1, may have the ability to perform DSP and ECC operations in parallel in memory while avoiding unnecessary data transfers between the memory dies and the host. Thus, the inputs and the results of the computations may be transferred from the host to the memory die.

Figure 5:
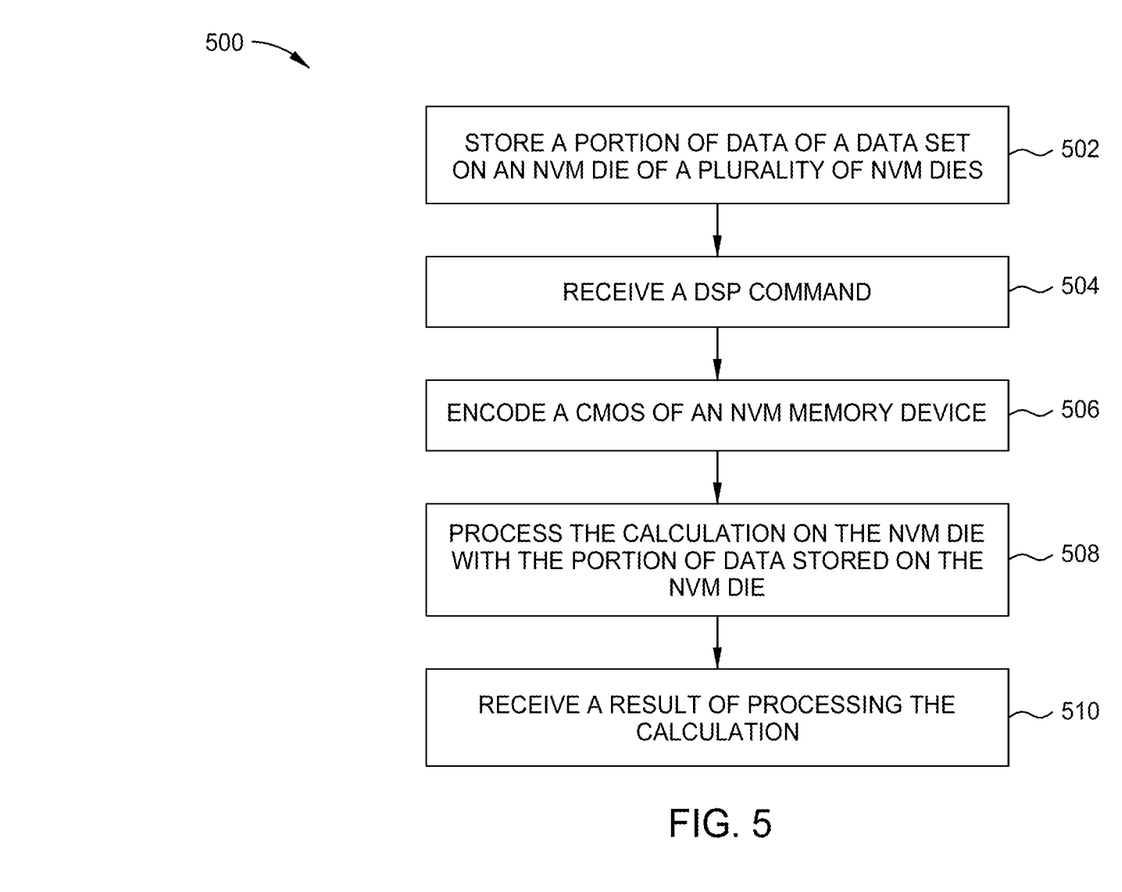
FIG. 5 is a flow diagram illustrating a method of digital signal processing, according to certain embodiments.

FIG. 5 is a flow diagram illustrating a method 500 of digital signal processing (DSP), according to certain embodiments. Method 500 may be implemented by the CMOS chip 402 of FIG. 4. At block 502, a portion of the data of a data set is stored on an NVM die of a plurality of NVM dies. The NVM die may be one of the plurality of memory dies 306a-306n of FIG. 3. At block 504, a controller, such as the controller 108 of FIG. 1, receives a DSP command. The DSP command includes a plurality of calculations, which may include forming a machine learning neuron, a mathematical transformation, image analysis, counting, searching, filtering, and the like. At block 506, a CMOS chip of the NVM memory device is encoded. The encoding includes encoding at least a portion of the data of the NVM die with the calculations of the DSP command. The encoding may include using a MAC unit, such as one of the plurality of MAC units 408a-408n of FIG. 4, an ALU, or a CPU. The encoding may occur on separate units in parallel.

At block 508, the calculations are processed on the NVM die with the portion of the data stored on the NVM die. The calculations may be completed in parallel using the plurality of MAC units 408a-408n. At block 510, the result of processing the calculations are received at an output latch, such as the NVM output latch 410 of FIG. 4, of the CMOS chip 402. The computational results from each of the plurality of MAC units 408a-408n are aggregated at the NVM output latch 410. The computational results may be programmed back to the respective NVM memory device or NVM die.

By using a host managed DSP with parallel computational capabilities, intensive computations may be completed in the memory device without a need to transfer intermediate data between the controller and the memory dies, thus improving latency and data storage device performance.

In one embodiment, a data storage device is disclosed that includes a memory device comprising a plurality of CMOS structures, each CMOS structure coupled to a portion of an NVM die, and a controller. The controller is configured to cause the data storage device to receive a command to perform a digital signal processing (DSP) computation, encode a portion of the DSP computation to each CMOS structure of the plurality of CMOS structures of the memory device; and receive an output of the DSP computation from the plurality of CMOS structures of the memory device.

The CMOS encodes a portion of the NVM to calculate the portion of the DSP computation. The NVM calculates the portion of the DSP computation using data stored on the NVM. The CMOS encodes a portion of the NVM as one of a multiply-accumulate unit (MAC), an arithmetic logic unit (ALU), or a central processing unit (CPU). The DSP computation comprises one of filtering, searching, counting, compression, image analysis, a mathematical transformation, or forming a machine learning neuron. The data storage device further includes a second memory device. The controller is further configured to encode a portion of the DSP computation to the second memory device and receive a second output of the DSP computation from the second memory device. The controller is further configured to aggregate the output and second output in response to the command.

In another embodiment, a controller for a data storage device is disclosed, that includes a memory device comprising computer-readable instructions, and a processor configured to read the computer-readable instructions that cause the processor to execute a method for digital signal processing. The method includes storing a portion of data of a data set on an NVM die of a plurality of NVM dies, the portion of data comprising an atomic unit of data, receiving a digital signal processing (DSP) command comprising a plurality of calculations, and encoding a CMOS of an NVM memory device comprising the CMOS coupled to an NVM die of the plurality of NVM dies, with a calculation of the plurality of calculations. The method further includes processing the calculation on the NVM die with the portion of data stored on the NVM die, and receiving a result of processing the calculation.

The method further includes storing a second portion of data of the data set on a second NVM die of the plurality of NVM dies and processing the calculation on the second NVM die. The second NVM die is coupled to the CMOS. The receiving of processing the calculation includes receiving a result of processing the calculation of the second NVM die. The CMOS encodes a portion of the NVM die with the calculation, comprising one of a multiply-accumulate unit (MAC), an arithmetic logic unit (ALU), or a central processing unit (CPU). The DSP command comprises one of forming a machine learning neuron, a mathematical transformation, image analysis, counting, searching, or filtering. The storing the portion of data of the data set comprises storing according to one of a zoned namespace, a key value pair, a stream, an endurance group/NVM set, and a device-internal file system of the controller. The method further comprising providing the result of processing the calculation to an output latch of the NVM. The controller further comprising back-propagating a portion of the result of processing the calculation to the NVM.

In another embodiment, a data storage device is disclosed, that includes a memory means, and a controller means configured to perform a method for digital signal processing (DSP). The method includes receiving a command to perform a DSP calculation comprising a plurality of atomic calculation components, encoding a plurality of dies of the memory means, each die encoded to calculate at least one of the plurality of atomic calculation components, and receiving an output of the DSP calculation.

The method further comprising the controller means aggregating output of each encoded die. The encoding the plurality of die of the memory means comprises encoding at least one of the plurality of die to function as a multiply-accumulate unit (MAC), an arithmetic logic unit, or a central processing unit (CPU). The DSP calculation comprises one of filtering, searching, counting, compression, image analysis, mathematical transformation, or machine learning. The method further comprising providing the output of the DSP calculation for one of the plurality of die of the memory means to an output latch, and back-propagating contents of the output latch back to the one of the plurality of die of the memory means.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
    a memory device comprising a plurality of CMOS structures, each CMOS structure coupled to a portion of an NVM die; and
    a controller configured to cause the data storage device to:
        receive a command to perform a digital signal processing (DSP) computation;
        encode a portion of the DSP computation to each CMOS structure of the plurality of CMOS structures of the memory device; and
        receive an output of the DSP computation from the plurality of CMOS structures of the memory device.

2. The data storage device of claim 1, wherein the CMOS structure encodes a portion of the NVM to calculate the portion of the DSP computation, and wherein the encoding by one or more CMOS structures of the plurality of CMOS structures occurs in parallel.

3. The data storage device of claim 2, wherein the NVM calculates the portion of the DSP computation, using data stored on the NVM.

4. The data storage device of claim 3, wherein the CMOS structure encodes a portion of the NVM as one of a multiply-accumulate unit (MAC), an arithmetic logic unit (ALU), or a central processing unit (CPU).

5. The data storage device of claim 4, wherein the DSP computation comprises one of filtering, searching, counting, compression, image analysis, a mathematical transformation, or forming a machine learning neuron.

6. The data storage device of claim 5, comprising a second memory device, the controller further configured to encode a portion of the DSP computation to the second memory device and receive a second output of the DSP computation from the second memory device.

7. The data storage device of claim 6, the controller further configured to aggregate the output and second output in response to the command.

8. A controller for a data storage device, comprising:
    a memory device comprising computer-readable instructions; and
    a processor configured to read the computer-readable instructions that cause the processor to execute a method for digital signal processing, the method comprising:
        storing a portion of data of a data set on an NVM die of a plurality of NVM dies, the portion of data comprising an atomic unit of data;
        receiving a digital signal processing (DSP) command comprising a plurality of calculations;
        encoding a CMOS of an NVM memory device comprising the CMOS coupled to an NVM die of the plurality of NVM dies, with a calculation of the plurality of calculations;
        processing the calculation on the NVM die with the portion of data stored on the NVM die; and
        receiving a result of processing the calculation.

9. The controller of claim 8, the method further comprising:
    storing a second portion of data of the data set on a second NVM die of the plurality of NVM dies, the second NVM die coupled to the CMOS; and
    processing the calculation on the second NVM die.

10. The controller of claim 9, wherein the processing the calculation includes receiving a result of processing the calculation of the second NVM die.

11. The controller of claim 10, wherein the CMOS encodes a portion of the NVM die with the calculation, comprising one of a multiply-accumulate unit (MAC), an arithmetic logic unit (ALU), or a central processing unit (CPU).

12. The controller of claim 11, wherein the DSP command comprises one of forming a machine learning neuron, a mathematical transformation, image analysis, counting, searching, or filtering.

13. The controller of claim 8, wherein storing the portion of data of the data set comprises storing according to one of a zoned namespace, a key value pair, a stream, an endurance group/NVM set, and a device-internal file system of the controller.

14. The controller of claim 8, further comprising back-propagating a portion of the result of processing the calculation to the NVM.

15. The controller of claim 10, the method further comprising providing the result of processing the calculation to an output latch of the NVM.

16. A data storage device comprising:
a memory means; and
a controller means configured to perform a method for digital signal processing (DSP) comprising:
receiving a command to perform a DSP calculation comprising a plurality of atomic calculation components;
encoding a plurality of dies of the memory means, each die encoded to calculate at least one of the plurality of atomic calculation components; and
receiving an output of the DSP calculation.

17. The data storage device of claim 16, the method further comprising the controller means aggregating output of each encoded die.

18. The data storage device of claim 17, wherein encoding the plurality of die of the memory means comprises encoding at least one of the plurality of die to function as a multiply-accumulate unit (MAC), an arithmetic logic unit, or a central processing unit (CPU).

19. The data storage device of claim 18, wherein the DSP calculation comprises one of filtering, searching, counting, compression, image analysis, mathematical transformation, or machine learning.

20. The data storage device of claim 19, the method further comprising providing the output of the DSP calculation for one of the plurality of die of the memory means to an output latch, and back-propagating contents of the output latch back to the one of the plurality of die of the memory means.

* * * * *